United States Patent [19]

Chadda et al.

[11] 4,228,581
[45] Oct. 21, 1980

[54] METHOD FOR PRODUCING SEMICONDUCTOR BODIES HAVING A DEFINED EDGE PROFILE WHICH HAS BEEN OBTAINED BY ETCHING AND IS COVERED WITH A GLASS

[75] Inventors: Madan M. Chadda, Nürnberg-Gaulnhofen; Reinhold Maier, Nuremberg, both of Fed. Rep. of Germany

[73] Assignee: SEMIKRON Gesellschaft für Gleichrichterbau und Elektronik m.b.H., Nuremberg, Fed. Rep. of Germany

[21] Appl. No.: 960,649

[22] Filed: Nov. 14, 1978

[30] Foreign Application Priority Data

Nov. 18, 1977 [DE] Fed. Rep. of Germany ....... 2751485

[51] Int. Cl.² .............................................. B01J 17/00
[52] U.S. Cl. ..................................... 29/578; 29/580; 29/583; 29/588
[58] Field of Search ................... 29/578, 580, 583, 588

[56] References Cited

U.S. PATENT DOCUMENTS

| 3,152,939 | 10/1964 | Borneman | 29/580 |
| 3,535,774 | 10/1970 | Baker | 29/580 |
| 3,608,186 | 9/1971 | Hutson | 29/583 |
| 3,852,876 | 12/1974 | Sheldon | 29/580 |
| 3,972,113 | 8/1976 | Nakata | 29/580 |

Primary Examiner—W. C. Tupman
Attorney, Agent, or Firm—Spencer & Kaye

[57] ABSTRACT

A method for producing semiconductor bodies having a glass covered defined edge profile from a semiconductor wafer comprising the steps of applying etch resistant protective coating to a surface oxide layer on the semiconductor wafer, cutting groove-shaped recesses in the wafer in a predetermined pattern, etching the wafer through the recesses to produce a deep portion passing through at least one pn-junction, removing the surface oxide layer and etch resistant coating, applying an insulating and stabilizing glass coating to the side faces of the deep portion of the wafer, applying a contact metal coating, dividing the wafer into semiconductor bodies along the center planes of selected deep portions of the wafer and covering the surface of the semiconductor bodies with an insulating lacquer at those portions which have been exposed by the dividing step.

7 Claims, 2 Drawing Figures

METHOD FOR PRODUCING SEMICONDUCTOR BODIES HAVING A DEFINED EDGE PROFILE WHICH HAS BEEN OBTAINED BY ETCHING AND IS COVERED WITH A GLASS

BACKGROUND OF THE INVENTION

The present invention relates to a method for producing semiconductor bodies having a glass-covered defined edge profile.

It is known that in semiconductor devices a reverse voltage carrying capability of 1000 volts or more can be attained by making the jacket surface of a preferably disc-shaped semiconductor body oblique, at least in the region where the pn-junction or junctions come to the surface. With this type of configuration, which hereinafter will be called a facet configuration, the critical field intensity at the surface is raised beyond that in the interior and thus the excess voltage carrying capability is improved. In addition, at least the surface section in the region of the pn-junction is provided with a coating of an insulating and stabilizing protective lacquer so that the reverse voltage carrying capability obtained with the aid of such a facet configuration will not be adversely influenced by undesirable impurities on the semiconductor surface.

Semiconductor bodies with facet configuration have been produced by a method in which a basic semiconductor wafer having large-area, layer-type zones of different conductivity types is provided with metal contact layers for connection to current leads. The wafer is then divided into elements of smaller areal expanse, whereupon facets are produced on the elements by individual treatment including etching or grinding after which they are covered with a protective lacquer.

Such work on individual elements is particularly expensive and often leads to undue divergences in the characteristics of the intended semiconductor devices.

These drawbacks are avoided with the process disclosed in German Offenlegungsschrift No. 26 32 348. It relates to the production of semiconductor bodies with defined edge profiles which are produced by etching. A basic semiconductor wafer is provided on one side with a contact electrode and on the other side with a continuous, highly doped, external zone, and on the latter with contact electrode regions whose geometry is determined by the desired subdivision of the wafer. The wafer is further covered on both sides with an etch-resistant coating which is provided, on the side of the contact electrode regions, with openings for etching in a pattern corresponding to the intended subdivision, following which it is etched. During this etching process, through-like recesses are produced which have greatly sloping side faces and simultaneously constitute separating grooves for the provided elements of smaller areal expanse. Subdivision of the wafer results in elements with a facetted edge profile is then covered with a protective lacquer. The profile etching is particularly enhanced in that a short-circuit is produced at a suitable point between the contact electrode and between the inner zone bordering at the highly doped outer zone.

Although this method permits the economic production of semiconductor bodies with the desired edge profile, it does not in all cases meet all of the particular requirements. Tests have shown that it is not always assured that the protective lacquer adheres sufficiently and uniformly enough or that the semiconductor surface is covered with the lacquer in a tight seal. Moreover, the protective lacquer often exhibits undesirable reactions with substances contained in the encapsulation masses that sealingly encase the semiconductor bodies.

These drawbacks can be overcome by providing glass-like coatings on the semiconductor surface of the edge profile. However, the use of such coatings in the above-mentioned process results in untenably high expenditures. Such glass coatings are produced at about 800° C. in an oxidixing atmosphere. At such process temperatures, however, the contact metal layer applied before the basic semiconductor wafer was etched also oxidizes and thus becomes unfit for use. The first contact metal coating must therefore be removed after the etching step and must be renewed after the glass coating has been applied. There then exists the additional danger that metal will remain on the semiconductor surface and adversely affect the efficiency of the surface treatment by means of the glass cover. Thus, in the known procedure, the edge profile, to be economical, can be coated only with a protective lacquer.

There also is known a process for producing semiconductor bodies with stabilizing glass coverings in which the basic semiconductor wafer is provided on its one or on both sides with trough-like recesses in addition to the separating grooves and in parallel therewith, and the faces of these recesses are covered with a glass coating. In such structures, the active surface area for current carrying capability is substantially reduced.

It is an object of the invention to make more economical the production of semiconductor bodies having a defined edge profile which are produced by etching and are covered with a glass coating, and to obtain semiconductor bodies that have an optimum amount of active surface area.

SUMMARY OF THE INVENTION

In the present invention, semiconductor bodies having a glass-covered defined edge profile are produced from a large-area semiconductor basic wafer having a sequence of layer-type zones of different conductivity type with at least one pn-junction and a surface oxide layer thereon. The semiconductor bodies are made by a method which comprises the steps of applying an etch-resistant protective coating onto the surface oxide layer and then cutting groove-shaped recesses in the semiconductor wafer in a predetermined pattern which extends through the protective coating and the surface oxide layer to the surface of the wafer for subdividing, the wafer into semiconductor bodies of smaller areal expanse.

The next step is to etch the semiconductor wafer through the recesses to produce each a deep portion therein which passes through at least one pn-junction of the wafer. This is done so that the side faces of the deep portion are shaped to form a predetermined edge profile of adjacent semiconductor bodies. Next, the surface oxide layer and etch resistant coating are removed from the wafer and an insulating and stabilizing glass coating applied to the side faces of the deep portion of the wafer. The wafer is then cleaned and a metal coating applied thereto.

The semiconductor wafer is next divided into smaller semiconductor bodies by dividing along the center planes of the selected deep portions of the wafer. Finally, the surfaces of the semiconductor bodies are covered with an insulating lacquer at those portions which have been exposed by the dividing step.

DESCRIPTION OF THE PREFERRED EMBODIMENTS

Figure 1:
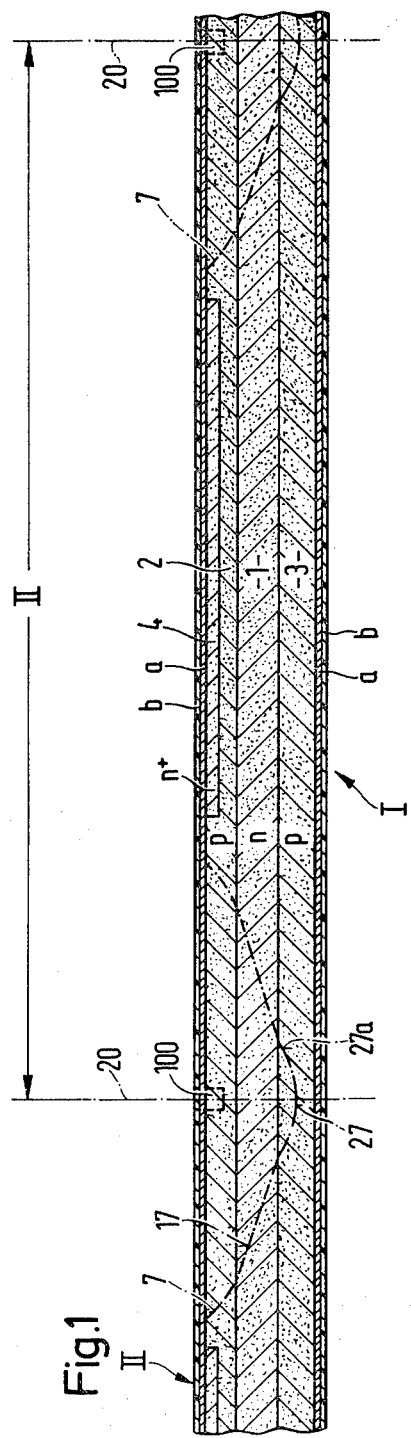
FIG. 1 shows a sectional view of a basic wafer showing the outline of an edge profile etched into one side.
Figure 2:
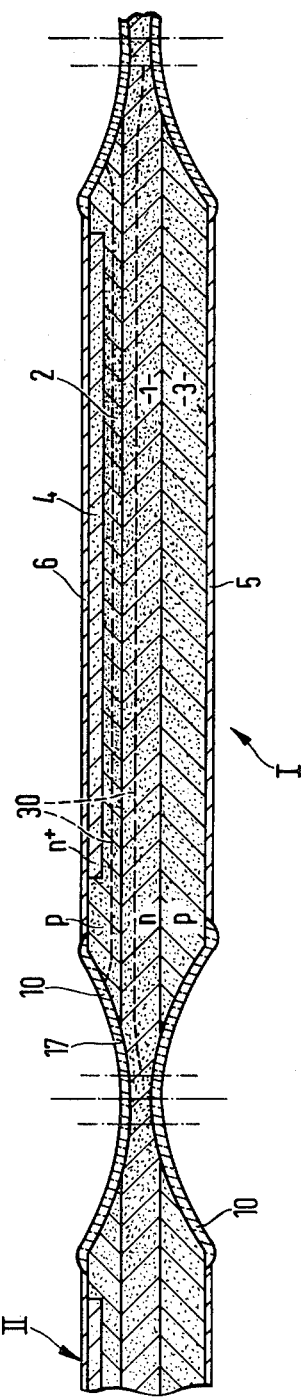
FIG. 2 shows a completed device in which an edge profile has been etched into both sides.

The production of embodiments of semiconductor bodies with defined edge profiles according to the invention will now be explained with the aid of sectional views of a basic semiconductor wafer illustrated in FIGS. 1 and 2. Both figures show a sectional view of a basic wafer having a sequence of four layer-type zones of alternating conductivity type. FIG. 1 shows an embodiment with an edge profile etched on one side and FIG. 2 shows an embodiment having an edge profile etched on both sides. Corresponding parts bear the same reference numerals in both figures.

The large-area semiconductor wafer I provided for treatment according to the invention may be made of silicon and has, for example, a zone sequence comprising a first n-conductive highly resistant zone 1, each a higher doped zone 2 and 3 of the opposite conductivity type each bordering on zone 1 on either side and a highly doped zone 4 of the same conductivity type as zone 1 produced in the outer zone 2. If such a zone sequence is produced by diffusion of impurity material in an oxygen-containing atmosphere or in the presence of oxygen containing substances there is produced, as is known, an oxide layer on the semiconductor surface which contains semiconductor and impurity materials such as phosphorus or boron. Such a layer is also called a glass layer and generally has a thickness of several microns.

Surprisingly, tests have shown that instead of a metallic layer on the highly doped outer zone of the starter disc, as disclosed in the above-mentioned Offenlegungsschrift as being essential to obtain a defined edge profile when an etching solution such as a composition of hydrofluoric acid, nitric acid and boric acid as disclosed in the German Offenlegungsschrift No. 24 37 048 is used, the oxide layer formed during the diffusion process is just as suitable. Further examinations have shown that an oxide layer formed on the semiconductor surface in a separate process step after diffusion without presence of oxygen contributes in the desired manner to the formation of a defined edge profile by means of etching, and that in semiconductor wafers without an oxide layer the desired facet configuration cannot be produced by etching. Passivation of the semiconductor surface produced at room temperature in ambient air does not serve as an oxide layer in the sense of this procedure. Moreover, the arrangement of an oxide layer according to the invention, in contradistinction to the prior art procedure, has brought the surprising result that no short circuit is required between the oxide layer and the zone 2 bordering the highly doped outer zone 4. Further, in contradistinction to the contact electrode regions of the known procedure, the oxide layer can be applied to the respective side of the basic disc without areal limitations.

It is assumed that the explanation for the effect of an oxide layer in the production of a defined edge profile by etching is that charges present in the oxide layer produce potential relationships with the semiconductor material which permit such formation.

The production of oxide layers on semiconductor material is known and is not part of the present invention.

The basic semiconductor wafer, which for the formation of the edge profile on the intended side has been provided with a silicon oxide layer a, is covered in a first process step with a layer b of an etch-resistant material such as picein. In this layer b, groove-shaped recesses 100 are made according to a given pattern for subdividing the wafer I into elements of smaller areal expanse. During their production, or in an additional etching process by means of a known etching solution, these recesses can be brought through the oxide layer a up to or into the outer zone of the semiconductor material. Thus the semiconductor material is exposed in the recesses and the etching process for producing the edge profile begins there.

The width of the recesses 100, together with the etching agent factors and the thickness of the doped zones, determines the etching time and thus the course of the edge profile. It is, however, not critical and is determined essentially by the requirement for lowest possible material losses on the one hand and sufficient surface area for the separating groove at the inner end of the edge profile, on the other hand. That is, it depends on the procedure by which the wafer I is subdivided. The recesses 100 can be applied, for example, by scoring or by means of a laser beam or can be already provided during application of layer b in a screen-printing process. Their width may by about 30 to 100 microns depending on the zone sequences in the intended semiconductor bodies and said recesses may be groove or wedge shaped.

In a further process step, deeper portions 7 starting from the recesses 100 are produced by means of an etching solution consisting of hydrofluoric acid, nitric acid, and as the basic components and of acetic acid as an additive as is known, for example, from German Offenlegungsschrift No. 24 37 048. These deep portions simultaneously serve to separate the wafer I into semiconductor bodies II and each one of their side faces constitutes a defined edge profile for the associated part of wafer I, which profile is then provided with a glass coating.

By selecting the factors which determine the etching process, preferably the time and etching temperature, deeper portions can be produced which have different sizes and the slope of their side faces is determined by the shape and depth of recesses 100 as well as by the impurity concentration of the semiconductor material to be removed.

Due to the known phenomenon that higher doped semiconductor material is removed intensively and over a large area but highly resistant material is removed slowly, an edge profile is produced during etching of the zone sequence with different impurity concentrations, which profile is formed of a section 17 having a flatter shape and a section 27a having a steeper shape.

Both sections together form a so-called double facet, as is desired for thyristors to assure a high excess voltage carrying capability.

In the embodiment according to FIG. 1, the edge profile is produced by etching the wafer from one side. In the layer sequence it extends so far that the two pn-junctions provided for high reverse voltages on both sides of the highly resistant center zone 1 are penetrated. As a result, the pn-junction between zones 1 and 2 forms an acute angle of a desired size with the jacket face of the semiconductor body. The facet section 27a also forms an acute angle with the pn-junction face between zones 1 and 3. Facet section 27a opens into the base surface 27 of the deeper portion 7 in which wafer I is separated into the intended semiconductor bodies, for example by breaking or sawing. The width of the base surface 27 must meet the requirement that during the breaking up of wafer I the glass coating 10 which also covers the base surface is not damaged within the facet section 27a.

Recesses of about 50 microns in width and about 20 to 50 microns in depth produce deeper portions 7 with favorable double facets.

In embodiments according to FIG. 2, the edge profile on both sides of basic wafer I is symmetrical to the center axis of each semiconductor body II as well as symmetrical to the center plane of the wafer. However, each deeper portion 7 ends in the highly resistant center zone 1. The expanse of the deeper portions 7 in such a double-sided edge profile is determined by the fact that each partial profile penetrates the most adjacent pn-junction. Consequently, it is necessary only that deeper portion 7 penetrate but slightly into the center zone 1. To enable economical further processing of wafer I, it is desirable for the provided semiconductor bodies II to remain connected together via the center zone 1 after the double sided edge profile has been formed. The etching process for producing the edge profile is consequently controlled in such a manner that the partial profiles 17 extend into zone 1 by only a few microns. The required etching time can be determined without difficulty in a preceding etching test when the other factors which determine the etching process are given.

An edge profile according to FIG. 2 assures optimum reverse voltage carrying capability as can be seen from the path of the space charge zones 30 toward the semiconductor surface.

In embodiments according to FIG. 2, deeper portions 7 having a slope angle of the edge profile 17 between 6° and 15° and a penetrating depth into the center zone of about 5 to 10 microns were obtained at a temperature between 10° C. and room temperature and with etching times between 40 and 10 minutes.

After the etching process has been completed, the etch resistant layer b and the oxide layer a are removed by Thereafter, the semiconductor surface of each of the provided semiconductor bodies II can be passivated with an insulating and stabilizing coating 10 of a glass in the region of the edge profile. For this purpose, a known glass compound, for example a lead aluminosilicate glass is mixed in pulverized form with a binder. The mixture is applied, for example, by spreading or spraying onto the respective surface sections and is melted at a temperature of about 800° C. In order to assure a perfect glass coating over the entire length of the edge profile, the base surface 27 is covered with glass approximately to the level where the facet section 17 starts. This also assures sufficient coating coverage at the transition between the two facet sections. This so-called glass passivation per se is not part of the present invention.

After application of the glass coating 10, the semiconductor wafer I is cleaned by etching on the surfaces serving to contact the provided semiconductor bodies II, i.e. at the outer faces disposed between the profile sections and it provided with contact layers 5, 6 by applying contact metals, e.g. by vapor deposition of aluminum and silver and subsequent alloying of the same. The contact metals can also be deposited without an electric current. In consideration of the melting temperature of the glass coating, contact metals are selected which have alloying temperatures not greater than 700° C.

Unless special structures for devices with more than two contact electrodes are required, the contact metals can be applied over the entire respective area, i.e. also over the glass coating 10. In that case, the metallization is removed from the glass by Then the basic disc I is divided up along the center axis of the deeper portions 7, e.g. by breaking, sawing or by means of a laser beam. The separating channels whose width may be 15 to 50 microns depending on the method employed, produce a section in the jacket surface of each semiconductor body II which is approximately perpendicular to the plane of the wafer and lies outside of the defined edge profile in the noncritical region. In this section the space charge zones come to the surface approximately parallel to the plane of the wafer so that in view of the configuration of the edge profile the critical surface field intensity is optimally reduced.

Since all of the pn-junctions are protected by the glass layer in the region where they come to the semiconductor surface, no surface soiling or damage can occur in this critical region during the separation process.

In order to electrically insulate the edge surface of each semiconductor body remaining after the separation, the edge surface is preferably coated with a protective lacquer.

The process according to the invention is not limited to the production of semiconductor bodies for discrete semiconductor devices. For example, with the same advantage semiconductor bodies can be produced which have two or more sections of identical layer structure which are mutually separated by profile etching on one side so as to produce integrated rectifier circuits. Moreover, semiconductor bodies can be produced which have sections for rectifier circuits as well as sections for semiconductor circuits of a different type which include passive and/or active semiconductor devices, the use of the present invention in this case producing, in an extensive circuit, spatially separated circuit components of a high reverse voltage carrying capability on a semiconductor wafer.

Under the same process conditions, the process according to the invention can produce in an economical manner semiconductor bodies with a facet-like edge profile and with a stabilizing glass layer from a basic, large-area semiconductor wafer, the loss of active surface area being reduced by about one third compared to the known structure. By giving the etching channel, controlling the etching process and, by selecting the doping concentration, the dge profile which simultaneously constitutes part of the subdivision pattern on the basic disc can be given an optimum configuration.

A detailed description of the method of making semiconductor bodies according to the invention is as follows:

With a known diffusion process for the production of the semiconductor basic wafer with at least one pn-junction a surface oxide layer is emerging with a thickness of approximately 0,5 to 2 micron, being suitable for the inventive method. Thereafter the intended etch-resistant protective coating is brought up to the surface of the wafer either by a silk-screen-process or by spreading the picein onto the entire surface and by a following laser step each in order to achieve the determined pattern of the provided recesses. Instead of the laser step the picein coating can be removed in places by trichlorethylene.

Then for the production of the recesses the oxide layer in the channels of the picein may be removed by hydrofluoric acid.

Thereafter the wafer is etched in a composition of 70 parts of volume hydrofluoric acid in 50 percent share, 20 parts nitric acid in 70 percent share, 5 parts acetic acid and 5 parts silicic acid; for the manufacture of the deep portions this step is carried out at a temperature of 5° to 15° C. and for a time of 5 to 30 minutes, depending on the depth and on the width of the deep portions. Before the passivation step the residual layers of protective coating and oxide must be removed as mentioned above. Then a known glass mixture is applied into the deep portions, for example, by spraying on the portion surfaces and spreading thereon. Subsequently the mixture layer is tempered in a temperature range of 750° to 900° C. depending on the glass type.

Thereafter the oxide layer of the surface sections between the deep portions is removed as mentioned above.

Now the contact metal coating is made by evaporating of Aluminium and silver for example and alloying at a temperature of 750° C. As a contact metal chromium and nickel can be applied with an alloying temperature of 650° C., each in a time of 5 to 30 minutes, depending on the desired layer thickness.

In a further step the basic wafer is subdivided by scribing or by sawing or by the laser method.

Finally the exposed faces of the semiconductor bodies are covered with a protective lacquer, for example of the type RTV of General Electric.

Materials for the glass coating are known from the U.S. Pat. No. 3,632,434.

For example known glass kinds consist of lead oxide, silicon dioxide and aluminum oxide.

It will be understood that the above description of the present invention is susceptible to various modifications, changes and adaptations, and the same are intended to be comprehended within the meaning and range of equivalents of the appended claims.

What is claimed is:

1. In a method for producing semiconductor bodies having a glass-covered defined edge profile, said semiconductor bodies being obtained by etching from a large-area semiconductor basic wafer having a sequence of layer-type zones of different conductivity type with at least one pn-junction and a surface oxide layer thereon, the steps comprising
   applying an etch-resistant protective coating onto said surface oxide layer,
   cutting groove-shaped recesses in said semiconductor wafer in a predetermined pattern which extend through said protective coating and said surface oxide layer to the surface of said semiconductor wafer for subdividing said wafer into said semiconductor bodies or smaller areal expanse,
   etching said semiconductor wafer through said recesses to produce each a deep portion therein which passes through at least one pn-junction of said wafer, the side faces of said deep portion being shaped to form a predetermined edge profile of adjacent semiconductor bodies,
   removing said surface oxide layer and etch-resistant coating from said wafer having deep portions, applying an insulating and stabilizing glass coating onto the side faces of said deep portions,
   cleaning the surface of said semiconductor wafer and applying a contact metal coating thereof,
   dividing said wafer into semiconductor bodies along the center planes of selected deep portions of said wafer, and
   covering the surface of said semiconductor bodies with an insulating lacquer at those portions which have been exposed by said dividing step.

2. The method defined by claim 1 wherein said recesses extend into one of the zones of different conductivity type of said semiconductor wafer.

3. The method defined by claim 1 wherein said deep portions are etched into one side of said semiconductor wafer so that they penetrate all of the pn-junctions therein.

4. The method defined by claim 1 wherein said deep portions are etched into each side of said semiconductor wafer so that they each penetrate the adjacent pn-junction.

5. The method defined by claim 1 wherein as said contact metals aluminum and silver, are applied and alloyed with the basic wafer.

6. The method defined by claim 1 wherein said etch-resistant protective coating is composed of picein.

7. The method defined by claim 1 wherein said surface oxide layer is made of the oxide of said wafer's semiconductor material or of an oxide comprising the oxide of said material.

* * * * *